(12) United States Patent
Bong et al.

(10) Patent No.: US 9,370,063 B2
(45) Date of Patent: Jun. 14, 2016

(54) LED DRIVING DEVICE AND LIGHTING DEVICE

(71) Applicant: SAMSUNG ELECTRONICS CO., LTD., Suwon-si (KR)

(72) Inventors: Sang Cheol Bong, Seoul (KR); Kyu Cheol Kang, Suwon-si (KR); Yu Kyung Kim, Yongin-si (KR); Kyoung Tae Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/689,699

(22) Filed: Apr. 17, 2015

(65) Prior Publication Data

US 2015/0373799 A1    Dec. 24, 2015

(30) Foreign Application Priority Data

Jun. 24, 2014 (KR) .................. 10-2014-0077240

(51) Int. Cl.
*H05B 33/08* (2006.01)
*H05B 39/06* (2006.01)

(52) U.S. Cl.
CPC ............ *H05B 33/0815* (2013.01); *H05B 39/06* (2013.01)

(58) Field of Classification Search
CPC ............ H05B 33/0815; H05B 33/083; H05B 33/0809; H05B 37/02; H05B 33/0845; H05B 33/0824; H05B 33/0818; H05B 39/04; H05B 39/048; H05B 33/0812; H05B 33/0851; H05B 33/0827; H05B 33/089
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 6,989,807 B2 | 1/2006 | Chiang |

(Continued)

FOREIGN PATENT DOCUMENTS

| | | |
|---|---|---|
| KR | 100995793 B1 | 11/2010 |
| KR | 100997050 B1 | 11/2010 |

(Continued)

OTHER PUBLICATIONS

"iML launches new line of low voltage AC Step Drivers for LED lighting applications"; iML Limited-press release; Jun. 21, 2013, 2 pages total.

(Continued)

*Primary Examiner* — Jany Richardson
(74) *Attorney, Agent, or Firm* — Sughrue Mion, PLLC

(57) ABSTRACT

A light emitting diode (LED) driving device is provided. The LED driving device includes a rectifier configured to rectify alternating current (AC) power to generate rectified power; an AC driver configured to control operations of a plurality of LED groups so that the plurality of LED groups receive the rectified power generated by the rectifier; and a light amount controller configured to reduce an amount of current applied to the plurality of LED groups when a peak value of the rectified power is increased, and increase the amount of current applied to the plurality of LED groups when the peak value of the rectified power is reduced.

20 Claims, 17 Drawing Sheets

(56) References Cited

U.S. PATENT DOCUMENTS

| | | | |
|---|---|---|---|
| 7,002,182 B2 | 2/2006 | Okuyama et al. |
| 7,081,722 B1 | 7/2006 | Huynh et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,111,009 B2 | 2/2012 | Tsai et al. |
| 8,129,711 B2 | 3/2012 | Kang et al. |
| 8,174,212 B2 | 5/2012 | Tziony et al. |
| 8,179,938 B2 | 5/2012 | Kim |
| 8,207,685 B2 | 6/2012 | Cheng et al. |
| 8,263,987 B2 | 9/2012 | Choi et al. |
| 8,324,646 B2 | 12/2012 | Lee et al. |
| 8,384,307 B2 | 2/2013 | Grajcar |
| 8,399,944 B2 | 3/2013 | Kwak et al. |
| 8,400,082 B2 | 3/2013 | Lee |
| 8,432,511 B2 | 4/2013 | Jeong |
| 8,459,832 B2 | 6/2013 | Kim |
| 8,461,765 B2 | 6/2013 | Liang et al. |
| 8,502,242 B2 | 8/2013 | Kim |
| 8,519,635 B2 | 8/2013 | Lin |
| 8,536,604 B2 | 9/2013 | Kwak et al. |
| 8,536,933 B2 | 9/2013 | Santo et al. |
| 8,569,956 B2 | 10/2013 | Shteynberg et al. |
| 8,598,796 B2 | 12/2013 | Jeong |
| 8,653,752 B2 | 2/2014 | Sakuragi et al. |
| 8,735,931 B2 | 5/2014 | Han et al. |
| 8,766,295 B2 | 7/2014 | Kim |
| 2011/0068693 A1 | 3/2011 | Hsu |
| 2011/0273103 A1 | 11/2011 | Hong |
| 2012/0098448 A1 | 4/2012 | Kang et al. |
| 2012/0146524 A1 | 6/2012 | Jeong |
| 2012/0206056 A1 | 8/2012 | Jung et al. |
| 2013/0049589 A1 | 2/2013 | Simi |
| 2013/0099688 A1 | 4/2013 | Pan |
| 2013/0169175 A1 | 7/2013 | Grajcar |
| 2013/0207555 A1 | 8/2013 | Qiu et al. |
| 2013/0257298 A1* | 10/2013 | Cheon .................... H05B 37/02 315/185 R |

FOREIGN PATENT DOCUMENTS

| | | |
|---|---|---|
| KR | 101187189 B1 | 10/2012 |
| KR | 1020120114998 A | 10/2012 |
| KR | 101198395 B1 | 11/2012 |
| KR | 101240522 B1 | 3/2013 |
| KR | 1020130030189 A | 3/2013 |
| KR | 101285644 B1 | 7/2013 |
| KR | 1 0201 301 08034 A | 10/2013 |
| KR | 101340295 B1 | 12/2013 |
| KR | 1020140024138 A | 2/2014 |
| WO | 2013039361 A1 | 3/2013 |

OTHER PUBLICATIONS

Manuel Arias, et al., "An Overview of the AC-DC and DC-DC Converters for LED Lighting Applications"; Automatika vol. 53 No. 2, Apr. 2012, pp. 156-172.

Masahiro Nishikawa, et al., "An LED Drive Circuit with Constant-Output-Current Control and Constant-Luminance Control", International Telecommunications Energy Conference, Nov. 2006, pp. 90-95, URL: http://hdl.handle.net/10069/22596.

\* cited by examiner

LED DRIVING DEVICE AND LIGHTING DEVICE

CROSS-REFERENCE TO RELATED APPLICATION

This application claims priority from Korean Patent Application No. 10-2014-0077240 filed on Jun. 24, 2014 in the Korean Intellectual Property Office, the disclosure of which is herein incorporated by reference.

BACKGROUND

1. Field

The present disclosure relates to an light emitting diode (LED) driving device and a lighting device.

2. Brief Description of the Related Art

Light emitting diodes (LEDs) are extensively used as light sources, because LEDs possess several positive attributes, such as low power consumption, high luminance, and the like. In particular, light emitting devices using LEDs have been employed in general illumination devices and in the backlight units of large-sized liquid crystal displays. Such light emitting devices are provided in the form of packages, facilitating the installation thereof in various apparatuses. In recent times, research into various LED driving devices using an alternating current (AC) step driver scheme capable of directly driving an LED using AC power without an AC-direct current (DC) converter have been conducted.

SUMMARY

One or more exemplary embodiments provide an LED driving device and a lighting device capable of simultaneously driving LEDs using AC power without an AC-DC converter.

According to an aspect of an exemplary embodiment, there is provided a light emitting diode (LED) driving device driving a plurality of LED groups, the LED driving device including a rectifier configured to rectify alternating current (AC) power to generate rectified power, an AC driver configured to control operations of the plurality of LED groups so that the plurality of LED groups receive the rectified power generated by the rectifier, and a light amount controller configured to reduce an amount of current applied to the plurality of LED groups when a peak value of the rectified power is increased, and to increase the amount of current applied to the plurality of LED groups when the peak value of the rectified power is reduced.

The light amount controller may include a voltage detector configured to detect the rectified power to generate a first voltage, and a current controller configured to adjust a level of a current applied to the plurality of LED groups according to the first voltage.

The voltage detector may include a regulator circuit configured to detect the rectified power and convert the rectified power into the first voltage, and the first voltage may have a substantially constant level.

The current controller may include a switching device that includes an output terminal, an input terminal, and a control terminal, the output terminal being connected to at least one of the plurality of LED groups, and an operational amplifier configured to receive the first voltage and a reference voltage and control a current flowing in the at least one LED group connected to the output terminal of the switching device.

The current controller may include a voltage follower configured to receive the first voltage, and a switching device that is configured to control a current flowing in the at least one of the plurality of LED groups through an output from the voltage follower circuit.

The AC driver may be configured to compare the rectified power with one or more threshold voltages and divides a single period of the rectified power into a plurality of sections, and may control operations of the plurality of LED groups in the plurality of sections.

The light amount controller may be configured to reduce a current applied to the plurality of LED groups in the plurality of sections when a peak value of the rectified power is increased, and increase a current applied to the plurality of LED groups in the plurality of sections when the peak value of the rectified power is decreased.

The one or more threshold voltages may include a first threshold voltage and a second threshold voltage that is higher than the first threshold voltage, and the AC driver may be configured to turn on a first LED group in a first section in which a level of the rectified power is lower than the first threshold voltage, and turn on the first LED group and a second LED group having a lower level of light output from the second LED group than that of the first LED group in a second section in which the level of the rectified power is higher than the first threshold voltage and lower than the second threshold voltage.

The one or more threshold voltages may include a first threshold voltage and a second threshold voltage that is higher than the first threshold voltage, and the AC driver may be configured to connect the first LED group and the second LED group to each other in parallel to then be turned on in the first section in which a level of the rectified power is lower than the first threshold voltage, and connect the first LED group and the second LED group to each other in series to then be turned on in the second section in which a level of the rectified power is higher than the first threshold voltage and lower than the second threshold voltage.

The first LED group and the second LED group may output substantially the same level of light.

According to an aspect of another exemplary embodiment, there is provided a lighting device including a light source that includes a plurality of LED groups, a rectifier configured to rectify AC power to generate rectified power, an AC driver configured to control operations of the plurality of LED groups to allow the light source to receive the rectified power and emit light, and a light amount controller configured to reduce an amount of current applied to the plurality of LED groups when a peak value of the rectified power is increased, and increase the amount of current applied to the plurality of LED groups when the peak value of the rectified power is reduced.

The light amount controller may include a regulator circuit configured to generate a first voltage having a substantially constant level using the rectified power, and a constant current controller configured to control a current flowing in at least a portion of the plurality of LED groups by comparing the first voltage with a reference voltage.

The lighting device may further include a regulator circuit configured to generate a first voltage having a substantially constant level using the rectified power, a voltage follower configured to receive the first voltage; and a constant current controller that is configured to control a current flowing in at least a portion of the plurality of LED groups using an output from the voltage follower circuit.

The plurality of LED groups may have different levels of light output.

The plurality of LED groups may have substantially the same level of light output.

According to an aspect of another exemplary embodiment, there is provided a light emitting diode (LED) driving device including a rectifier that to rectify alternating current (AC) power and provide the rectified power directly to a plurality of LED groups, a light amount controller configured to control supply of the rectified power to the plurality of LED groups, and an AC driver configured to drive the plurality of LED groups according to the rectified power, wherein the light amount controller is configured to control the AC driver to reduce an amount of current applied to the plurality of LED groups when a peak value of the rectified power is increased, and increase the amount of current applied to the plurality of LED groups when the peak value of the rectified power is reduced.

BRIEF DESCRIPTION OF DRAWINGS

The above and/or other aspects will be more clearly understood from the following detailed description taken in conjunction with the accompanying drawings, in which.

DETAILED DESCRIPTION

Figure 1:
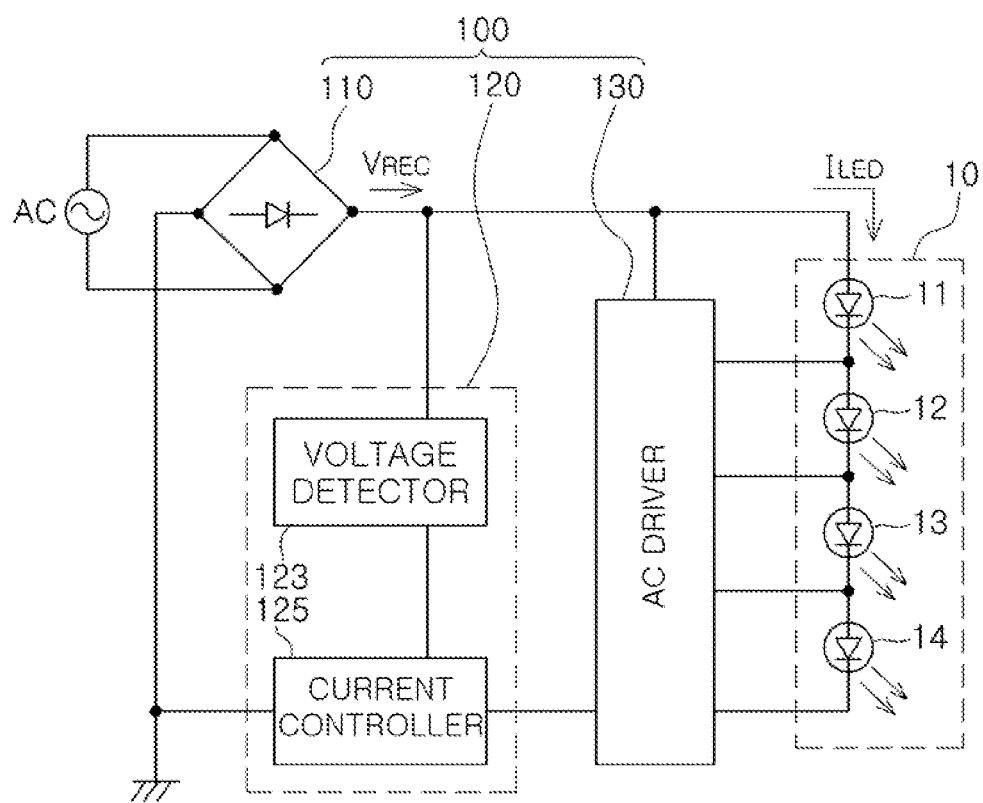
FIGS. 1 and 2 are block diagrams of an LED driving device according to an exemplary embodiment.

Various embodiments will now be described more fully with reference to the accompanying drawings in which some embodiments are shown. The present disclosure may, however, be embodied in different forms and should not be construed as limited to the embodiments set forth herein. Rather, these embodiments are provided so that this disclosure is thorough and complete and fully conveys the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an embodiment can be implemented differently, functions or operations described in a particular block may occur in a different way from a flow described in the flowchart. For example, two consecutive blocks may be performed simultaneously, or the blocks may be performed in reverse according to related functions or operations.

Exemplary embodiments will now be described in detail with reference to the accompanying drawings.

The present disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
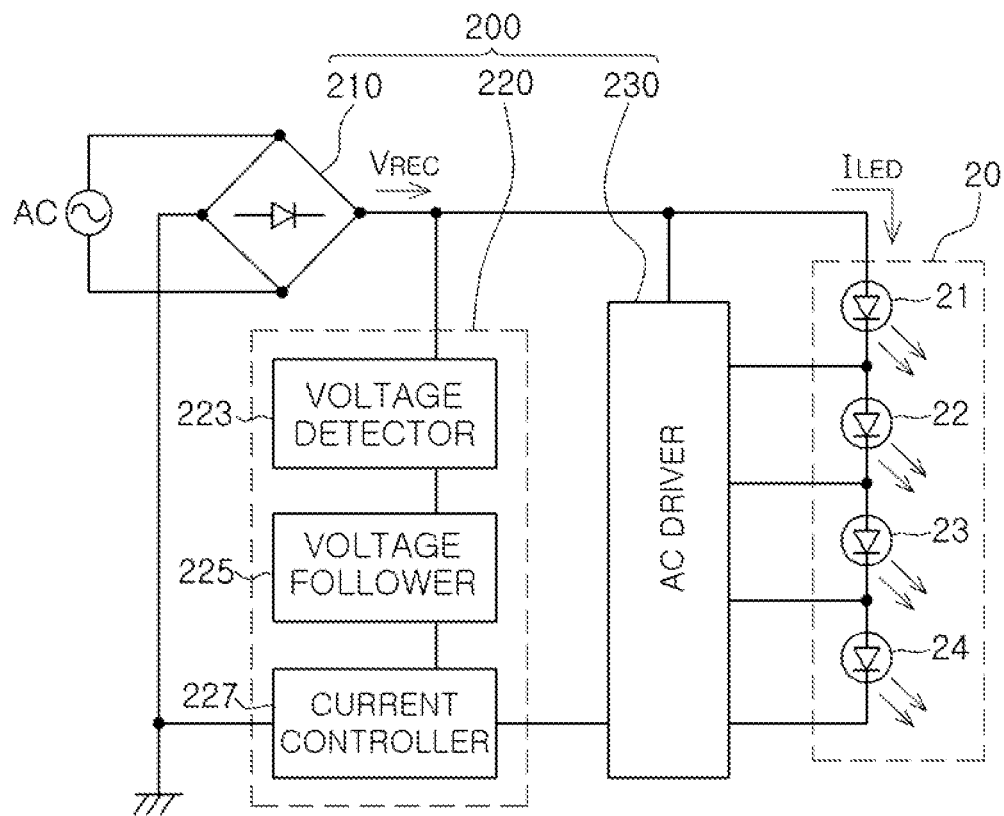

FIGS. 1 and 2 are block diagrams of an LED driving device according to an exemplary embodiment.

With reference to FIG. 1, an LED driving device 100 according to an exemplary embodiment may include a rectifier 110, a light amount controller 120, and an AC driver 130. The rectifier 110 may receive commercially available AC power and output rectified power $V_{REC}$. The AC driver 130 may control operations of a plurality of LED groups 11, 12, 13 and 14 included in a light source 10 such that the light source 10 may directly receive the rectified power $V_{REC}$ to operate. The light amount controller 120 may control light output from the light source 10 by detecting a voltage level of the rectified power $V_{REC}$ and adjust a level of current $I_{LED}$ applied to the light source 10.

The LED driving device 100 operating according to the exemplary embodiment may control operations of the light source 10 including the plurality of LED groups 11, 12, 13 and 14. The plurality of LED groups 11, 12, 13 and 14 included in the light source 10 may have the same level of light or different levels of light output therefrom. That is, in some exemplary embodiments, each LED group 11, 12, 13, and 14 may have a different level of light output, such that the level of light output from LED group 11 is different than that of LED group 12, which are different than that of LED group 13, etc.

When the plurality of LED groups 11, 12, 13 and 14 have substantially the same level of light output therefrom, the AC driver 130 may change a serial or parallel connection structure of the plurality of LED groups 11, 12, 13 and 14, according to a voltage level of the rectified power $V_{REC}$ within a single period of the rectified power $V_{REC}$. The AC driver 130 may divide a level of the rectified power $V_{REC}$ into several sections within a single period of the rectified power $V_{REC}$ and may increase the number of LED groups 11, 12, 13 and 14 connected to one another in parallel in a section in which the level of the rectified power $V_{REC}$ is relatively low, and may increase the number of LED groups 11, 12, 13 and 14 connected to one another in series in a section in which the level of the rectified power $V_{REC}$ is relatively high.

When the plurality of LED groups 11, 12, 13 and 14 have different levels of light output therefrom, the AC driver 130 may change the number of the plurality of LED groups turned on according to a voltage level of the rectified power $V_{REC}$ within a single period of the rectified power $V_{REC}$. The AC driver 130 may divide a level of the rectified power $V_{REC}$ into several sections within a single period of the rectified power $V_{REC}$ and may turn on a relatively large number of LEDs in a section in which the level of the rectified power $V_{REC}$ is relatively high.

The light amount controller 120 may detect a voltage level of the rectified power $V_{REC}$ to control a current $I_{LED}$ applied to the light source 10. In detail, the voltage level of the rectified power $V_{REC}$ may be determined by a voltage level of AC power applied to the rectifier 110. However, actually in some exemplary embodiments, the voltage level of the rectified power $V_{REC}$ is not be constantly maintained and may be varied in each respective period of the rectified power $V_{REC}$. For example, when the rectifier 110 includes a diode bridge circuit and the AC power generates a voltage signal having a peak value of 220V, the voltage level of the rectified power $V_{REC}$ generated by the rectifier 110 may have a peak value of 220V in each period. However, for several reasons, voltage levels of the rectified power $V_{REC}$ generated by the rectifier 110 may have different peak values, slightly changed in each period, which may be a factor changing light output from the light source 10.

In order to significantly reduce a change in light output according to a change in a voltage level of the rectified power $V_{REC}$ as described above, the light amount controller 120 may detect a voltage level of the rectified power $V_{REC}$ and control the current $I_{LED}$ applied to the light source 10. For example, when the peak value of the rectified power $V_{REC}$ is increased, the light amount controller 120 may reduce an amount of current $I_{LED}$ applied to the light source 10 within a single period of the rectified power $V_{REC}$. On the other hand, when the peak value of the rectified power $V_{REC}$ is reduced, the light amount controller 120 may increase an amount of current $I_{LED}$ applied to the light source 10 within a single period of the rectified power $V_{REC}$. Thus, even in a case in which a voltage level of the rectified power $V_{REC}$ is changed in each respective period of the rectified power $V_{REC}$, a change in light output from the light source 10 may be significantly reduced.

The light amount controller 120 may include a voltage detector 123 and a current controller 125. The voltage detector 123 may include a voltage regulator circuit capable of detecting a voltage level of the rectified power $V_{REC}$. The current controller 125 may compare an amount of voltage output from the voltage detector 123 with a predetermined amount of reference voltage so as to control a magnitude of the current $I_{LED}$ applied to the light source 10. The operation of the light amount controller 120 will be described in detail below with reference to FIG. 3.

Next, with reference to FIG. 2, an LED driving device 200 according to an exemplary embodiment may include a rectifier 210, a light amount controller 220, and an AC driver 230. The rectifier 210 may receive commercially available AC power and output rectified power $V_{REC}$. The AC driver 230 may control operations of a plurality of LED groups 21, 22, 23 and 24 included in a light source 20 such that the light source 20 may directly receive the rectified power $V_{REC}$ to operate. The light amount controller 220 may control light output from the light source 20 by detecting a voltage level of the rectified power $V_{REC}$ to adjust an amount of current $I_{LED}$ applied to the light source 20.

Similar to the case in the exemplary embodiment of FIG. 1, the AC driver 230 may control operations of the plurality of LED groups 21, 22, 23 and 24 according to a voltage level of the rectified power $V_{REC}$. The AC driver 230 may change a serial or parallel connection structure of the LED groups 21, 22, 23 and 24 or change the number of turned-on LED groups 21, 22, 23 and 24, according to a change in a voltage level of the rectified power $V_{REC}$ within a single period of the rectified power $V_{REC}$. For example, the AC driver 230 may control operations of the plurality of LED groups 21, 22, 23 and 24 such that the light source 20 may directly receive the rectified power $V_{REC}$ having AC characteristics to operate.

On the other hand, a magnitude of a current $I_{LED}$ applied to the light source 20 may be adjusted by the light amount controller 220. The light amount controller 220 may adjust the magnitude of the current $I_{LED}$ applied to the light source 20 by detecting a voltage level of the rectified power $V_{REC}$. In an exemplary embodiment, when a peak value of the voltage level of the rectified power $V_{REC}$ is increased, the light amount controller 220 may reduce the magnitude of current $I_{LED}$ applied to the light source 20, and when a peak value of the voltage level of the rectified power $V_{REC}$ is reduced, the light amount controller 220 may increase the magnitude of current $I_{LED}$ applied to the light source 20.

The light amount controller 220 may include a voltage detector 223, a voltage follower 225, and a current controller 227. The voltage detector 223 may include a voltage regulator circuit capable of detecting a voltage level of the rectified power $V_{REC}$. The current controller 227 may compare an amount of voltage output from the voltage detector 223 with an amount of reference voltage so as to control the magnitude of current $I_{LED}$ applied to the light source 20. The amount of the reference voltage may be predetermined. The voltage follower 225 may be disposed between the voltage detector 223 and the current controller 227 so as to match levels of impedance. The operation of the light amount controller 220 will be described in detail below with reference to FIG. 4.

Figure 3:
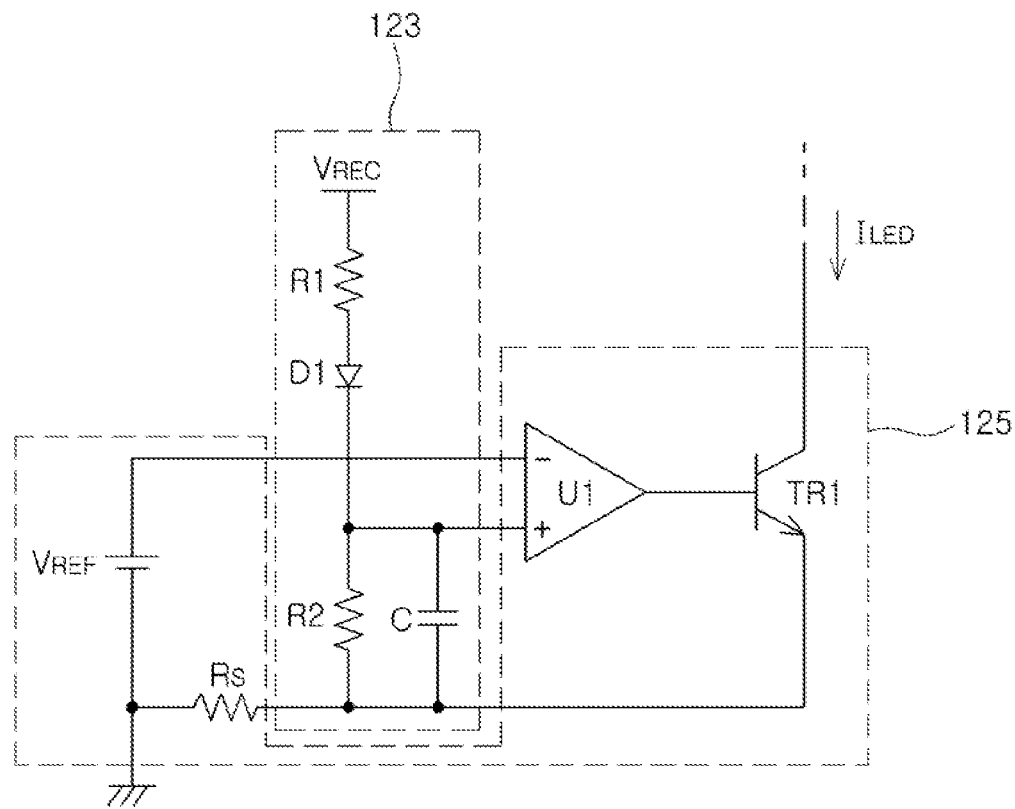
FIG. 3 is a circuit diagram of a light amount controller applied to the LED driving device illustrated in FIG. 1.

FIG. 3 is a circuit diagram of a light amount controller applied to an LED driving device illustrated in FIG. 1. The operation of the light amount controller 120 illustrated in FIG. 3 will be described together referring to the waveform diagrams of FIGS. 5 and 6.

With reference to FIG. 3, the light amount controller 120 according to the exemplary embodiment may include the voltage detector 123 detecting a voltage level of the rectified power $V_{REC}$ generated by the rectifier 110, and the current controller 125 comparing the voltage detected by the voltage detector 123 with an amount of reference voltage $V_{REF}$ so as to control the current $I_{LED}$ applied to the light source 10. The amount of the reference voltage $V_{REF}$ may be predetermined. The current controller 125 may include an operational amplifier U1 and a switching device TR1. For example, when the switching device TR1 is a bipolar junction transistor (BJT), a collector terminal of the switching device TR1 may be connected to the light source 10 and the current $I_{LED}$ applied to the light source 10 may flow to the collector terminal of the switching device TR1.

The voltage detector 123 may detect a voltage level of the rectified power $V_{REC}$ output by the rectifier 110. The voltage detector 123 may include a voltage regulator circuit, and an output from the voltage detector 123 may be input to a non-inverted terminal of the operational amplifier UI to be compared to the reference voltage $V_{REF}$.

In terms of operational amplifier characteristics, since levels of voltages input to a non-inverted terminal and an inverted terminal should be equal to each other, when a voltage level of the rectified power $V_{REC}$ is increased, a level of current flowing in a resistor R1 may be increased. On the other hand, when a voltage applied to both terminals of a resistor Rs is denoted as Vs, a voltage V+ input to the non-inverted terminal of the operational amplifier UI may be defined as illustrated in Equation Expression 1. I2 in Equation Expression 1 denotes the current flowing in a resistor R2.

$$V+V_{REF}=I2*R2+Vs \quad \text{[Equation Expression 1]}$$

When the voltage level of the rectified power $V_{REC}$ is increased, the current I2 flowing in the resistor R2 may increase and the voltage Vs may decrease. Since an emitter current of the switching device TR1 may be provided by a difference between the current I2 and a current flowing in the resistor Rs, the emitter current of the switching device TR1 may be reduced according to an increase in the voltage level of the rectified power $V_{REC}$. Thus, a collector current of the switching device TR1 may be decreased and the current $I_{LED}$ flowing in the light source 10 may also be decreased.

In the reverse case, when the voltage level of the rectified power $V_{REC}$ is reduced, the current I2 may be reduced and the voltage Vs may be increased. Thus, since the current flowing in the resistor R2 is increased, the emitter current and the collector current of the switching device TR1 may be increased. As a result, since the magnitude of the current $I_{LED}$ flowing in the light source 10 is increased, a level of light output from the light source 10 may be increased.

Figure 5:
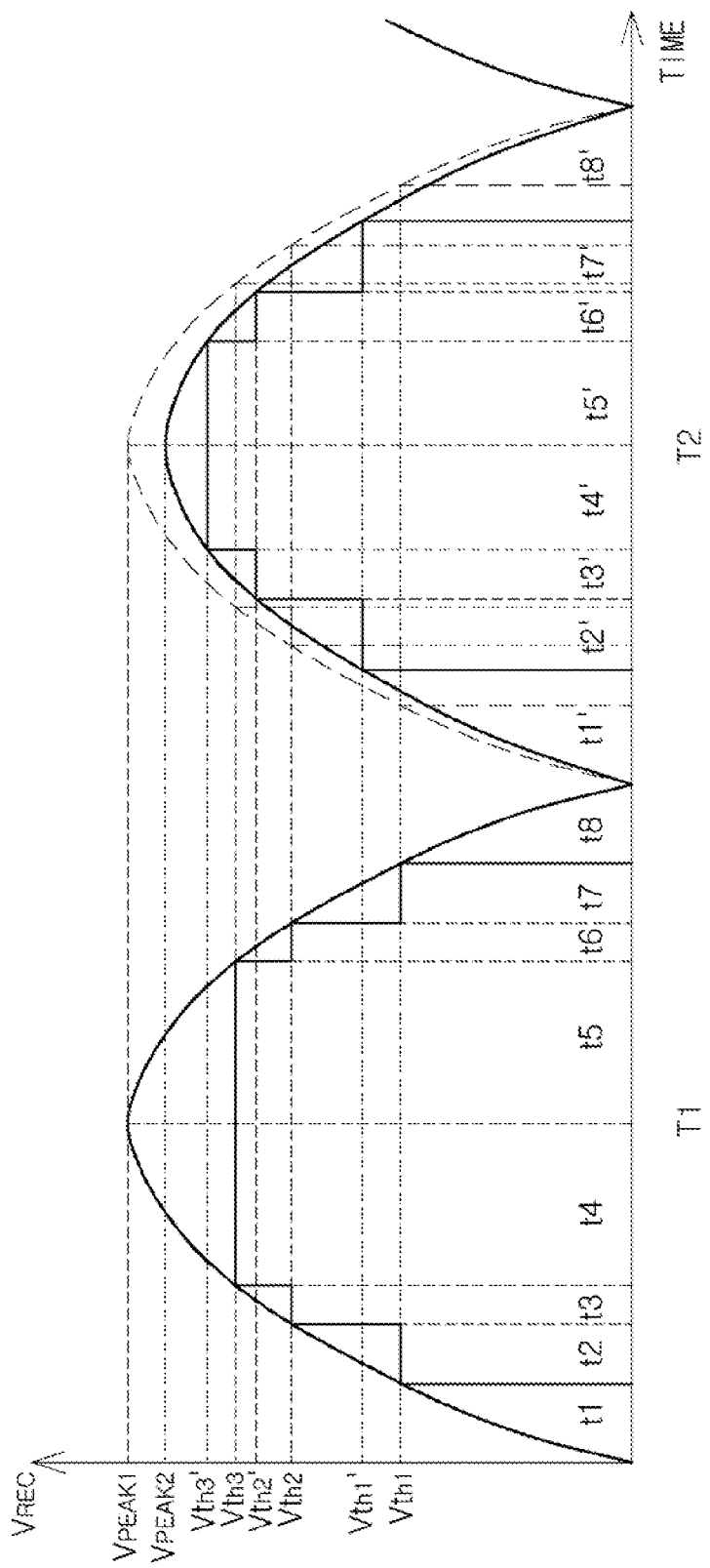
FIGS. 5 and 6 are waveform diagrams illustrating operations of an LED driving device according to an exemplary embodiment.
Figure 6:
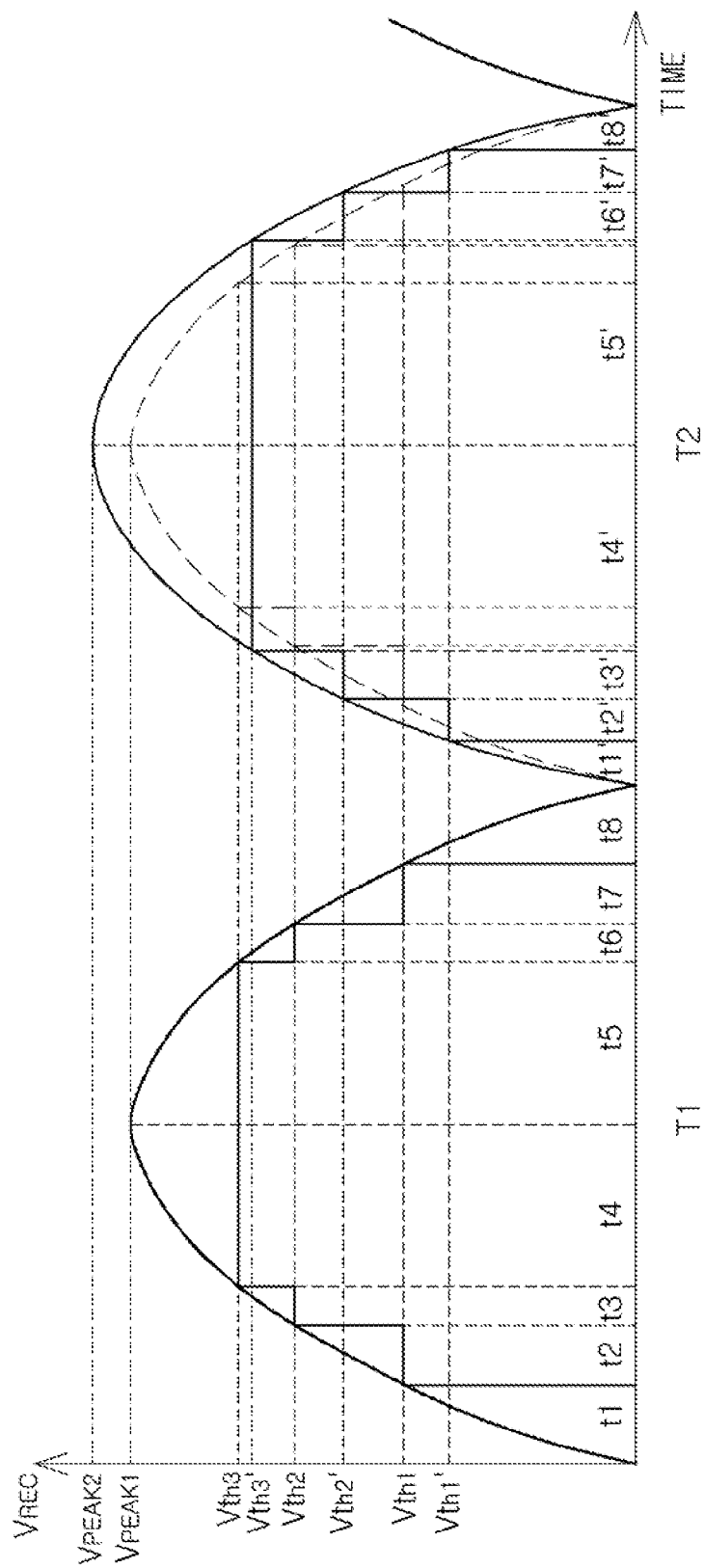

FIGS. 5 and 6 are waveform diagrams illustrating operations of an LED driving device according to an exemplary embodiment. First, the operation of the LED driving device 100 performed when the voltage level of the rectified power $V_{REC}$ is increased will first be described with reference to FIG. 5.

With reference to FIG. 5, in a first period T1, the rectified power $V_{REC}$ may have a first peak voltage $V_{peak1}$, and the first period T1 may be divided into a total of eight sections t1 to t8. The eight sections t1 to t8 configuring the first period T1 may be defined by the rectified power $V_{REC}$ and a plurality of threshold voltages $V_{th1}$, $V_{th2}$ and $V_{th3}$. Similarly, a second period T2 may also be divided into eight sections t1' to t8' by the rectified power $V_{REC}$ and a plurality of threshold voltages $V_{th1'}$, $V_{th2'}$ and $V_{th3'}$. In the respective sections t1 to t8 of the first period T1, the AC driver 130 may set the number of turned-on LED groups 11, 12, 13 and 14 to be different from one another among the plurality of LED groups 11, 12, 13 and 14 included in the light source 10, or may set a serial connection structure or a parallel connection structure between the LED groups 11, 12, 13 and 14 to be different from one another.

In a case in which the plurality of LED groups 11, 12, 13 and 14 have substantially the same level of light output therefrom, the AC driver 130 may increase the number of the LED groups 11, 12, 13 and 14 connected to one another in parallel when the voltage level of the rectified power $V_{REC}$ relatively low, and may increase the number of LED groups 11, 12, 13 and 14 connected to one another in series when the voltage level of the rectified power $V_{REC}$ is relatively high. For example, the AC driver 130 may connect all of the LED groups 11, 12, 13 and 14 to one another in parallel in the first and eighth sections t1 and t8 of the first period T1, and may connect all of the LED groups 11, 12, 13 and 14 to one another in series in the fourth and fifth sections t4 and t5 of the first period T1.

In a case in which the plurality of LED groups 11, 12, 13 and 14 have different respective levels of light output therefrom, the AC driver 130 may reduce the number of operating LED groups 11, 12, 13 and 14 when the voltage level of the rectified power $V_{REC}$ is relatively low, and may increase the number of operating LED groups 11, 12, 13 and 14 when the voltage level of the rectified power $V_{REC}$ is relatively high. In this case, in order to significantly reduce a difference in levels of light output within the respective periods T1 and T2 of the rectified power $V_{REC}$, the LED group 11 operating when the voltage level of the rectified power $V_{REC}$ is relatively low may have a relatively high level of light output therefrom as compared to those of the other LED groups 12, 13 and 14.

In some exemplary embodiments, the AC driver 130 may only turn on the first LED group 11 having a highest level of light output from the light source in the first and eighth sections t1 and t8 of the first period T1, and may turn off the remaining LED groups 12, 13 and 14. In the fourth and fifth sections t4 and t5 of the first period T1, the AC driver 130 may turn on all of the LED groups 11, 12, 13 and 14.

On the other hand, the light amount controller 120 may adjust the magnitude of the current $I_{LED}$ applied to the light source 10 in each respective period T1 or T2. With reference to FIG. 5, the voltage level of the rectified power $V_{REC}$ may have a smaller value in the second period T2 than in the first period T1. Further, referring to FIG. 5, the first peak voltage $V_{peak1}$ of the rectified power $V_{REC}$ represented in the first period T1 may be greater than that a second peak voltage $V_{peak2}$ of the rectified power $V_{REC}$ represented in the second period T2.

In a case in which the current $I_{LED}$ is applied to the light source 10 regardless of a change in a voltage level that may occur in each period of the rectified power $V_{REC}$, a level of light output from the light source 10 in the second period T2 in which the voltage level of the rectified power $V_{REC}$ is reduced may be significantly reduced as compared to that of light output from the light source 10 in the first period T1. This degree of reduction in the level of light output from the light source in the second period T2 may be recognized by a user as a variation in the output of light, and this leads to deteriorations in reliability of the LED driving device 100.

In the exemplary embodiment, when the voltage level of the rectified power $V_{REC}$ is reduced, the light amount controller 120 may increase the amount of current $I_{LED}$ flowing in the light source 10 as illustrated with reference to FIG. 3. Thus, as illustrated in FIG. 5, in the second period T2 in which the voltage level of the rectified power $V_{REC}$ is reduced, the magnitude of the current $I_{LED}$ flowing in the light source 10 may be rather increased. In addition, lengths of the sections t4' and t5' in which a greatest magnitude of current $I_{LED}$ flows in the light source 10 may be shorter than those of the first period T1. Therefore, a difference in levels of light output from the light source 10 between the first period T1 and the second period T2 may be significantly reduced.

Then, with reference to FIG. 6, the voltage level of the rectified power $V_{REC}$ may be further increased in the second period T2 than in the first period T1. For example, the second peak voltage $V_{peak2}$ of the rectified power $V_{REC}$ in the second period T2 may be greater than the first peak voltage $V_{peak1}$ of the rectified power $V_{REC}$ in the first period T1.

As illustrated above with reference to FIGS. 1 to 6, the light amount controller 120 may significantly decrease the magnitude of the current $I_{LED}$ flowing in the light source 10 when the voltage level of the rectified power $V_{REC}$ is increased. With reference to FIG. 6, the magnitude of the current $I_{LED}$ flowing in the light source 10 in each respective section t1'~t8' of the second period T2 may be smaller than the current $I_{LED}$ flowing in the light source 10 in each respective section t1~t8 of the first period T1. In addition, lengths of the sections t4' and t5' in which a greatest magnitude of current $I_{LED}$ flows in the light source 10 in the second period T2 may be longer than those in the first period T1. Therefore, a difference in levels of light output from the light source 10 between the first period T1 and the second period T2 may be significantly reduced.

Figure 4:
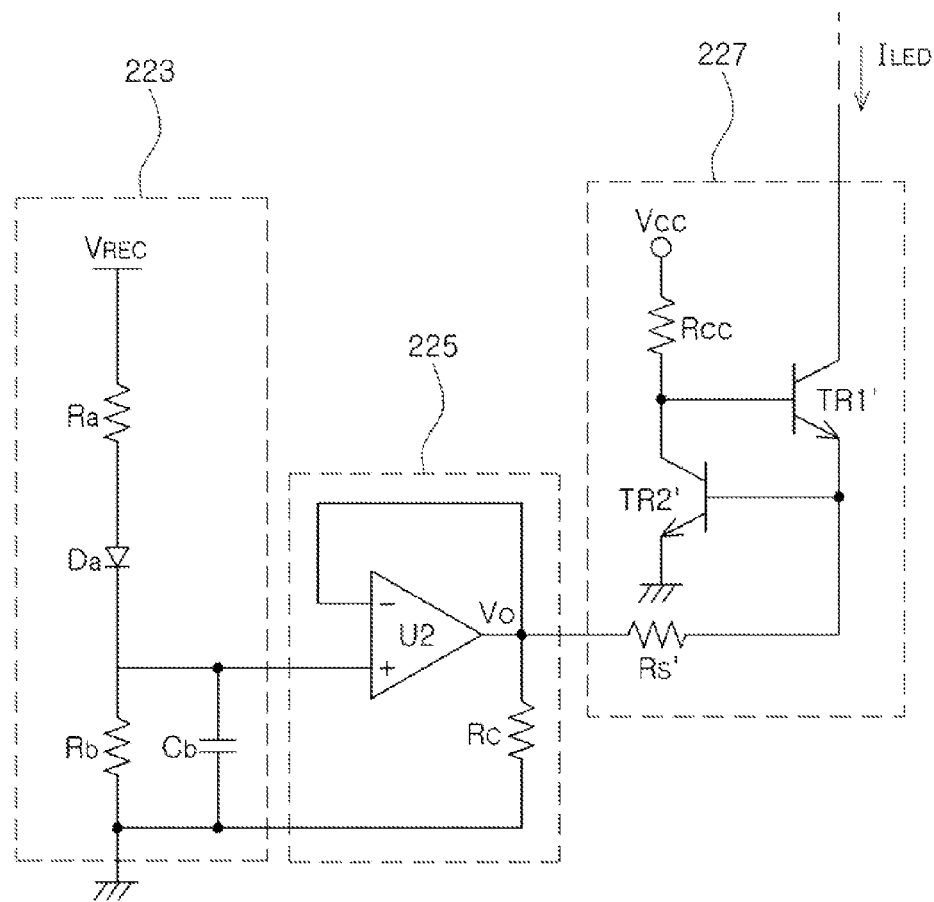
FIG. 4 is a circuit diagram of a light amount controller applied to the LED driving device illustrated in FIG. 2.

FIG. 4 is a circuit diagram of a light amount controller applied to an LED driving device illustrated in FIG. 2.

With reference to FIG. 4, the light amount controller 220 may include a voltage detector 223, a voltage follower 225, and a current controller 227. The voltage detector 223 may include a voltage regulator circuit and may generate a voltage proportional to a peak value of the rectified power $V_{REC}$. A voltage output by the voltage detector 223 may be input to a non-inverted terminal of an operational amplifier U2 included in the voltage follower 225. The voltage output from the operational amplifier U2 may be proportional to the voltage output by the voltage detector 223 and input to the non-inverted terminal of the operational amplifier U2 in terms of circuit characteristics of the voltage follower 225. On the other hand, the voltage follower 225 may be a circuit used for impedance matching between the voltage detector 223 and the current controller 227.

An output from the voltage follower 225 may be connected to an emitter terminal of a first switching device TR1' and a base terminal of a second switching device TR2' through a resistor Rs'. A driving voltage Vcc may be supplied to a collector terminal of the second switching device TR2' through a driving resistor Rcc, and a current $I_{LED}$ flowing in a light source 20 may be input to a collector terminal of the first switching device TR1'.

Since the emitter terminal of the first switching device TR1' and the base terminal of the second switching device TR2' are connected to each other, an emitter voltage of the first switching device TR1' may be the same voltage as a base-emitter voltage of the second switching device TR2'. On the other hand, the emitter voltage of the first switching device TR1' may be defined as illustrated in the following Equation Expression 2. In Equation Expression 2, Is' denotes a current flowing in the resistor Rs', and Vo denotes a voltage output from the operational amplifier U2.

$$V_E = Is'*Rs' + Vo \quad \text{[Equation Expression 2]}$$

Since the emitter voltage of the first switching device TR1' is fixed as the base-emitter voltage $V_{BE}$ of the second switching device TR2', when the voltage Vo output by the operational amplifier U2 is increased, the current Is' may be decreased, and when the voltage Vo output by the operational amplifier U2 is decreased, the current Is' may be increased. Since the rectified power $V_{REC}$ output by the rectifier 210 and the voltage Vo output by the operational amplifier U2 are in proportion to each other, when the voltage level of the rectified power $V_{REC}$ is increased, the current Is' may be decreased. The current Is' may be provided as the collector current of the first switching device TR1' and may be in proportion to the current $I_{LED}$ flowing in the light source 20, the emitter current of the first switching device TR1'. Thus, when the voltage level of the rectified power $V_{REC}$ is increased, the current $I_{LED}$ flowing in the light source 20 may be decreased. On the other hand, when the voltage level of the rectified power $V_{REC}$ is reduced, the current $I_{LED}$ flowing in the light source 20 may be increased.

The light amount controller 220 illustrated in FIG. 4 may operate in a manner similar to the light amount controller 120 illustrated in FIG. 3, and when the rectified power $V_{REC}$ is applied to the light source 20 in the manner as illustrated in FIGS. 5 and 6, a deviation in light output from the light source 20 may be significantly reduced.

With reference to FIG. 5, the voltage level of the rectified power $V_{REC}$ may have a lower peak value in the second period T2 than that in the first period T1. The light amount controller 220 may significantly reduce a deviation in the levels of light output from the light source 20 in the first period T1 and the second period T2 by increasing the magnitude of the current $I_{LED}$ flowing in the light source 20 during the second period T2 by reflecting the reduction in the voltage level of the rectified power $V_{REC}$.

Subsequently, with reference to FIG. 6, the voltage level of the rectified power $V_{REC}$ may have a higher peak value in the second period T2 than that in the first period T1. The light amount controller 20 may significantly reduce a deviation in the levels of light output from the light source 20 in the first period T1 and the second period T2 by decreasing the magnitude of the current $I_{LED}$ flowing in the light source 20 during the second period T2 by reflecting the increase in the voltage level of the rectified power $V_{REC}$.

FIGS. 7A to 8D are circuit diagrams illustrating a connection structure of a plurality of LED groups according to operations of an LED driving device according to an exemplary embodiment.

First, operations of the LED driving device 100 illustrated in FIG. 1 will be described with reference to FIGS. 5 to 7D. Referring to FIGS. 5 and 6, the rectified power $V_{REC}$ generated by the rectifier 110 may be divided into a plurality of sections in a single period T1 or T2. Although FIGS. 5 and 6 illustrate cases in which one period T1 or T2 of the rectified power $V_{REC}$ is divided into a total of 8 sections t1 to t8 or t1' to t8', respectively, these cases are only provided as examples, and thus, the present disclosure is not necessarily limited thereto. Hereinafter, operations of the LED driving device 100 will be described, based on the first period T1 illustrated in FIGS. 5 and 6 for convenience of explanation. However, operations of the LED driving device 100 in the first period T1 may also be applied to the operations of the LED driving device 100 in the second period T2 of FIGS. 5 and 6. In addition, operations described with reference to FIGS. 7A to 7D may also be applied to the LED driving device 200 illustrated in FIG. 2.

In sections t1 and t8 in which the level of the rectified power $V_{REC}$ is higher than a reference potential 0V and is lower than a first threshold voltage $V_{th1}$, the AC driver 130 may perform controlling so that the current $I_{LED}$ may only flow in the first LED group 11. In this case, the first LED group 11 may have a relatively high level of light output therefrom than that in the remaining LED groups 12, 13 and 14. In some exemplary embodiments, the reference potential may alternatively be a non-zero value. Moreover, the reference potential may be determined experimentally.

In sections t2 and t7 in which the level of the rectified power $V_{REC}$ is higher than the first threshold voltage $V_{th1}$ and is lower than a second threshold voltage $V_{th2}$, the AC driver 130 may perform controlling so that the first and second LED groups 11 and 12 may be connected to each other in series to emit light. In addition, in sections t3 and t6 in which the level of the rectified power $V_{REC}$ is higher than the second threshold voltage $V_{th2}$ and is lower than a third threshold voltage $V_{th3}$, the first to third LED groups 11 to 13 may emit light. In sections t4 and t5 in which the level of the rectified power $V_{REC}$ is higher than the third threshold voltage $V_{th3}$ and is lower than the first peak voltage $V_{peak1}$ of the first period T1 of the rectified power $V_{REC}$, all of the LED groups 11, 12, 13 and 14 may emit light.

Figure 7A:
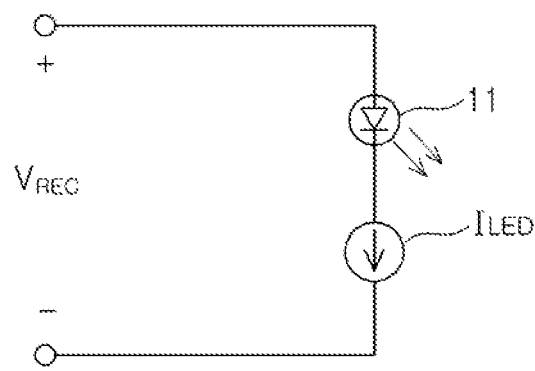
FIGS. 7A to 7D and 8A to 8D are circuit diagrams illustrating an example of a connection structure of a plurality of LED groups according to operations of an LED driving device according to an exemplary embodiment.

FIGS. 7A to 7D are equivalent circuit diagrams illustrating a connection structure of respective LED groups 11, 12, 13 and 14 according to a level of the rectified power $V_{REC}$ in a single period of the rectified power $V_{REC}$. First, FIG. 7A illustrates a connection structure of the plurality of LED groups 11, 12, 13 and 14 in sections t1 and t8 in which the level of the rectified power $V_{REC}$ is higher than the reference potential 0V and is lower than the first threshold voltage $V_{th1}$. Referring to FIG. 7A, in the sections t1 and t8 in which the level of the rectified power $V_{REC}$ is higher than the reference potential 0V and is lower than the first threshold voltage $V_{th1}$, only the first LED group 11 may emit light. A current flowing in the first LED group 11 may be defined as a constant current I1.

Figure 7B:
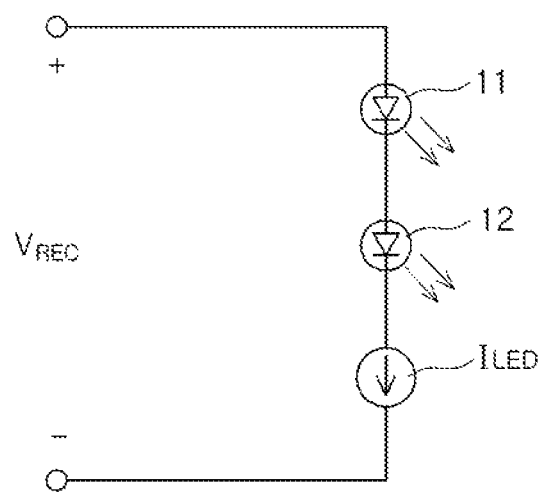

FIG. 7B illustrates a connection structure of the respective LED groups 11, 12, 13 and 14 in sections t2 and t7 in which the level of the rectified power $V_{REC}$ is higher than the first threshold voltage $V_{th1}$ and is lower than the second threshold voltage $V_{th2}$. Referring to FIG. 7B, in the sections t2 and t7 in which the level of the rectified power $V_{REC}$ is higher than the first threshold voltage $V_{th1}$ and is lower than the second threshold voltage $V_{th2}$, the first LED group 11 and the second LED group 12 may be connected to each other in series to emit light. In this case, a constant current flowing in the first LED group 11 and the second LED group 12 may be defined as I2.

Figure 7C:
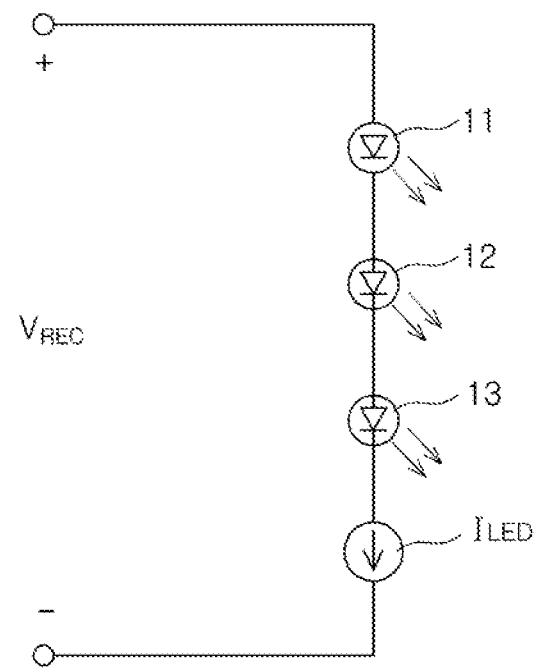
Figure 7D:
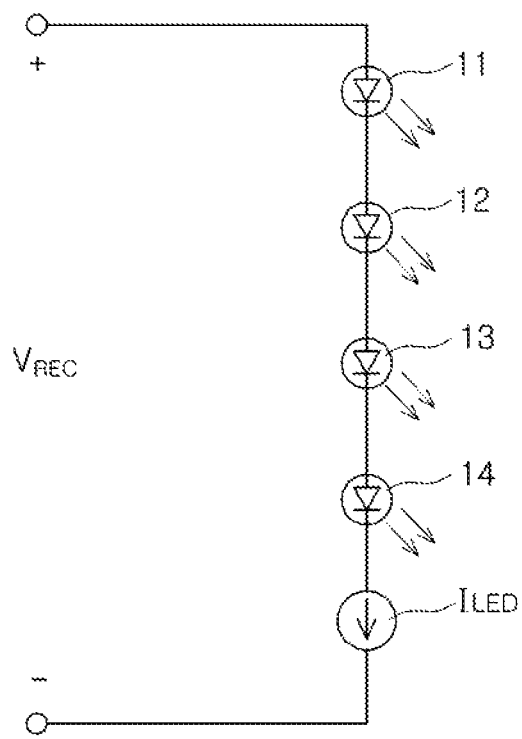

Similarly, FIGS. 7C and 7D illustrate a connection structure of the LED groups 11, 12, 13 and 14 in sections t3 and t6 in which the level of the rectified power $V_{REC}$ is higher than the second threshold voltage $V_{th2}$ and lower than the third threshold voltage $V_{th3}$ and in sections t4 and t5 in which the level of the rectified power $V_{REC}$ is higher than the third threshold voltage $V_{th3}$ and lower than the first peak voltage $V_{peak1}$ of the rectified power $V_{REC}$. For example, with reference to FIGS. 7A and 7D, as the level of the rectified power $V_{REC}$ is increased so as to approximate the peak voltage $V_{peak}$ within a single period T1, a relatively large number of LED groups 11, 12, 13 and 14 may be connected to one another in series and may thus emit light. In the reverse case, as the level of the rectified power $V_{REC}$ is reduced so as to approximate the reference potential 0V within a single period T1, a relatively small number of LED groups 11, 12, 13 and 14 may be connected to one another in series and may thus emit light. Thus, in order to significantly reduce a change in light output from the light emitting unit 10 depending on a change in a level of the rectified power $V_{REC}$ within a single period, the first LED group 11 may have a highest level of light output therefrom, and the fourth LED group 14 may have a lowest level of light output therefrom.

On the other hand, the level of the current $I_{LED}$ flowing in the light source 10 in the respective sections t1 to t8 may be determined by the light amount controller 120. The light amount controller 120 may compare a voltage level of the rectified power $V_{REC}$ to a level of reference voltage and may determine the level of the current $I_{LED}$ flowing in the light source 10 according to the comparison result. The level of the reference voltage may be predetermined, and may be determined experimentally. With reference to the embodiment of FIG. 5 as an example, the level of the current $I_{LED}$ flowing in the light source 10 in the first section t1 of the first period T1 may be higher than that of the current $I_{LED}$ flowing in the light source 10 in the first section t1 of the second period T2. With reference to the exemplary embodiment of FIG. 6 as an example, the level of the current $I_{LED}$ flowing in the light source 10 in the first section t1 of the first period T1 may be lower than that of the current $I_{LED}$ flowing in the light source 10 in the first section t1 of the second period T2. Here, in a case in which the voltage levels of the rectified power $_{REC}$ are different from each other in the first period T1 and the second period T2, the light amount controller 120 may determine that the magnitudes of the currents $I_{LED}$ flowing in the light source 10 are different from each other. As the light amount controller 120 controls the current $I_{LED}$ flowing in the light source 10, based on the voltage level of the rectified power $V_{REC}$, even in a case in which the voltage levels of the rectified power $V_{REC}$ are different in respective periods T1 and T2, a deviation in the levels of light output from the light source 10 may be significantly reduced.

Subsequently, operations of the LED driving device 200 illustrated in FIG. 2 will be described with reference to FIGS. 5 and 6 and FIGS. 8A to 8D. The rectified power $V_{REC}$ generated by the rectifier 210 may be divided into a plurality of sections t1 to t8 or t1' to t8' in a single period T1 or T2. Although FIGS. 5 and 6 illustrate the cases in which one period T1 or T2 of the rectified power $V_{REC}$ is divided into a total of 8 sections t1 to t8 or t1' to t8', respectively, the cases are provided as only examples, and thus, the present disclosure is not necessarily limited thereto. Hereinafter, operations of the LED driving device 200 will be described below, based on the first period T1 illustrated in FIGS. 5 and 6 for convenience of explanation. However, operations of the LED driving device 200 in the first period T1 may also be applied to the operations of the LED driving device 200 in the second period T2 of FIGS. 5 and 6. In addition, operations described with reference to FIGS. 8A to 8D may be applied to the LED driving device 100 illustrated in FIG. 1.

Figure 8A:
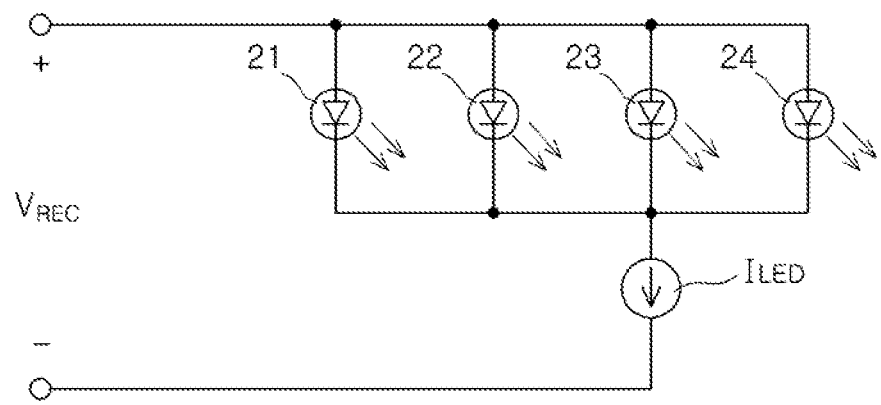

In sections t1 and t8 in which the level of the rectified power $V_{REC}$ is higher than the reference potential 0V and is lower than the first threshold voltage $V_{th1}$, the AC driver 230 may perform controlling so that the LED groups 21, 22, 23 and 24 are connected to one another in parallel as illustrated in FIG. 8A. Here, a sum of currents flowing in the respective LED groups 21, 22, 23 and 24 may be defined as IF.

Figure 8B:
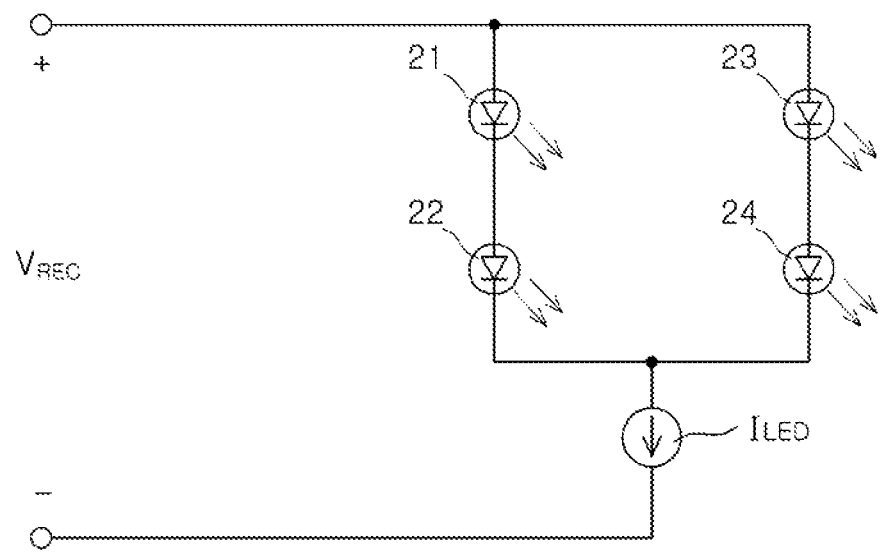
Figure 8C:
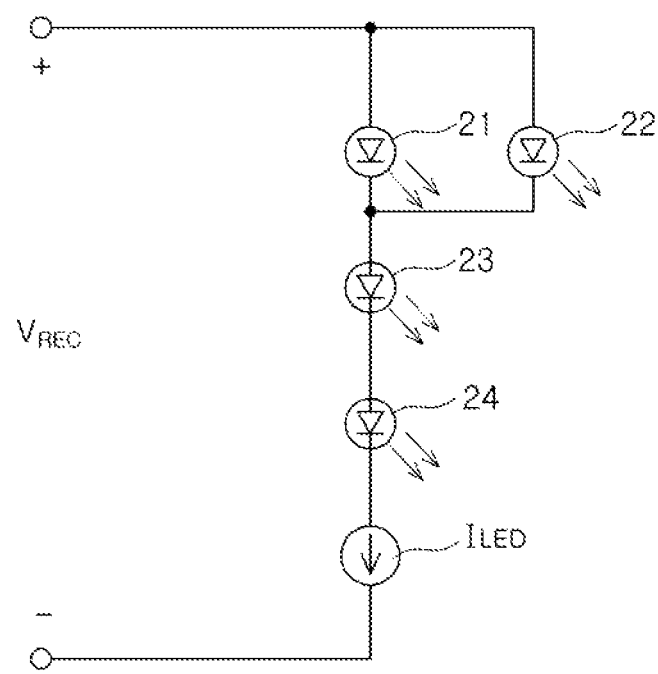
Figure 8D:
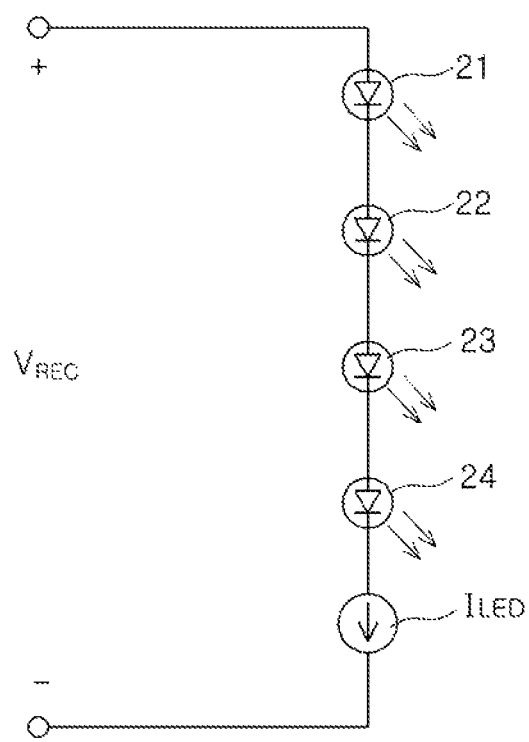

In sections t2 and t7 in which the level of the rectified power $V_{REC}$ is higher than the first threshold voltage $V_{th1}$ and lower than the second threshold voltage $V_{th2}$, the first LED group 21 and the second LED group 22 may be connected to each other in series and the third LED group 23 and the fourth LED group 24 may be connected to each other in series as illustrated in FIG. 8B. Further, the first LED group 21 and the second LED group 22, and the third LED group 23 and the fourth LED group 24 may be connected to each other in parallel. In sections t3 and t6 in which the level of the rectified power $V_{REC}$ is higher than the second threshold voltage $V_{th2}$ and lower than the third threshold voltage $V_{th3}$, the first LED group 21, the third LED group 23, and the fourth LED group 24 may be connected to one another in series, and the second LED group 22 may be connected to the first LED group 21 in parallel as illustrated in FIG. 8C.

In sections in which the level of the rectified power $V_{REC}$ is higher than the third threshold voltage $V_{th3}$ and is lower than the first peak voltage $V_{peak1}$ of the rectified power $V_{REC}$, all of the LED groups 21, 22, 23 and 24 may be connected to one another in series. For example, according to the exemplary embodiment, the LED groups 21, 22, 23 and 24 may emit light constantly, regardless of a change in a voltage level within a single period t1 of the rectified power $V_{REC}$. However, a connection structure of the respective LED groups 21, 22, 23 and 24 may be changed depending on a change in a voltage level within a single period t1 of the rectified power $V_{REC}$. On the other hand, according to the exemplary embodiment, the levels of light output from the respective LED groups 21, 22, 23 and 24 may be substantially identical to each other.

The level of the current $I_{LED}$ flowing in the light source 20 in the respective sections t1 to t8 may be determined by the light amount controller 220. The light amount controller 220 may detect a voltage level of the rectified power $V_{REC}$, and may determine the level of the current $I_{LED}$ flowing in the light source 20 using the voltage level of the detected rectified power $V_{REC}$. With reference to the exemplary embodiment of FIG. 5 as an example, the level of the current $I_{LED}$ flowing in the light source 20 in the first section t1 of the first period T1 may be higher than that of the current $I_{LED}$ flowing in the light source 20 in the first section t1 of the second period T2. With reference to the exemplary embodiment of FIG. 6 as an example, the level of the current $I_{LED}$ flowing in the light source 20 in the first section t1 of the first period T1 may be lower than that of the current $I_{LED}$ flowing in the light source 20 in the first section t1 of the second period T2. For example, in a case in which the voltage levels of the rectified power $_{REC}$ are different from each other in the first period T1 and the second period T2, the light amount controller 220 may determine that the magnitudes of the currents $I_{LED}$ flowing in the light source 20 are different from each other. As the light amount controller 220 controls the current $I_{LED}$ flowing in the light source 20, based on the voltage level of the rectified power $V_{REC}$, even in a case in which the voltage levels of the rectified power $V_{REC}$ are different in respective periods T1 and T2, a deviation in the levels of light output from the light source 20 may be significantly reduced.

Figure 9:
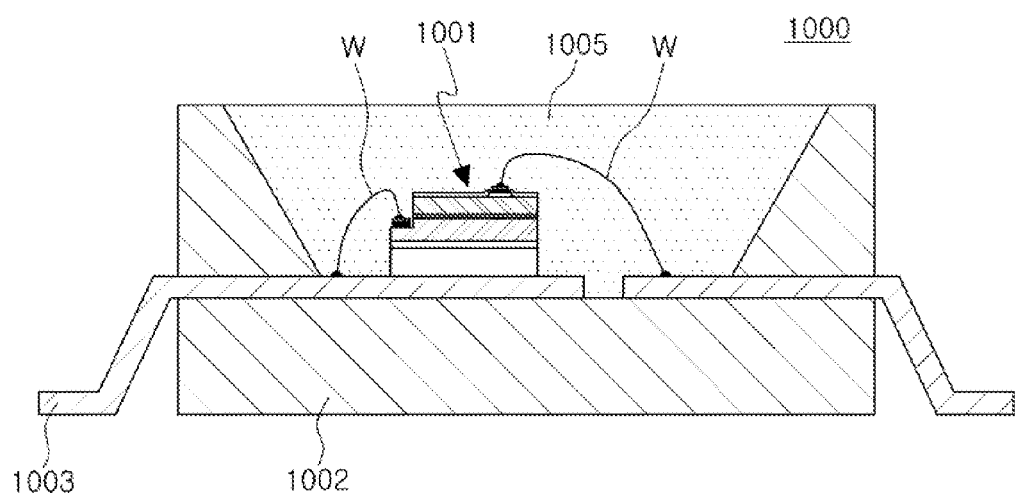
FIGS. 9 and 10 illustrate LED packages applied to a lighting device including an LED driving device according to an exemplary embodiment.
Figure 10:
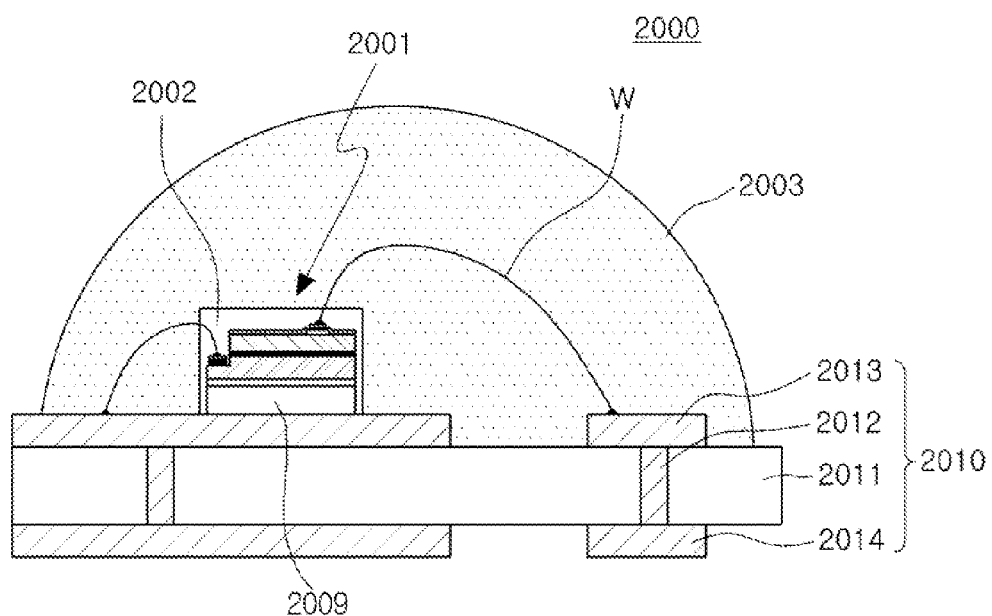

FIGS. 9 and 10 illustrate LED packages operated by the LED driving device according to an exemplary embodiment. The light emitting units of the light source 10 and the light source 20 may be packaged in the LED packages illustrated in FIGS. 9 and/or 10.

With reference to FIG. 9, a semiconductor light emitting device package 1000 may include a semiconductor light emitting device 1001, a package body 1002, and a pair of lead frames 1003. The semiconductor light emitting device 1001 may be mounted on the lead frame 1003 to be electrically connected to the lead frame 1003 through a wire W. According to an exemplary embodiment, the semiconductor light emitting device 1001 may also be mounted in other regions instead of the lead frame 1003, for example, in the package body 1002. In addition, the package body 1002 may have a cut shape to improve light reflection efficiency. Such a reflective cup may be provided with an encapsulation body 1005 formed thereon, filled with a light transmitting material encapsulating the semiconductor light emitting device 1001, the wire W, and the like.

With reference to FIG. 10, a semiconductor light emitting device package 2000 may include a semiconductor light emitting device 2001, a mounting substrate 2010, and an encapsulation body 2003. In addition, a wavelength converter 2002 may be formed on a surface and a side of the semiconductor light emitting device 2001. The semiconductor light emitting device 2001 may be mounted on the mounting substrate 2010 and electrically connected to the mounting substrate 2010 through a wire W and a conductive substrate 209.

The mounting substrate 2010 may include a substrate body 2011, an upper electrode 2013, and a lower electrode 2014. In addition, the mounting substrate 2010 may include a through electrode 2012 connecting the upper electrode 2013 and the lower electrode 2014 to each other. The mounting substrate 2010 may be provided as a substrate such as a printed circuit board (PCB), a metal-core printed circuit board (MCPCB), a multilayer printed circuit board (MPCB), a flexible printed circuit board (FPCB), and the like, and the structure of the mounting substrate 2010 may be variously applied.

The wavelength converter 2002 may contain a phosphor, a quantum dot, or the like. An upper surface of the encapsulation body 2003 may have a convex, dorm-shaped lens structure, but according to an exemplary embodiment, the surface thereof may be a convex or a concave shaped lens structure, so as to be able to adjust an angle of beam spread in light emitted through the upper surface of the encapsulation body 2003.

Figure 11:
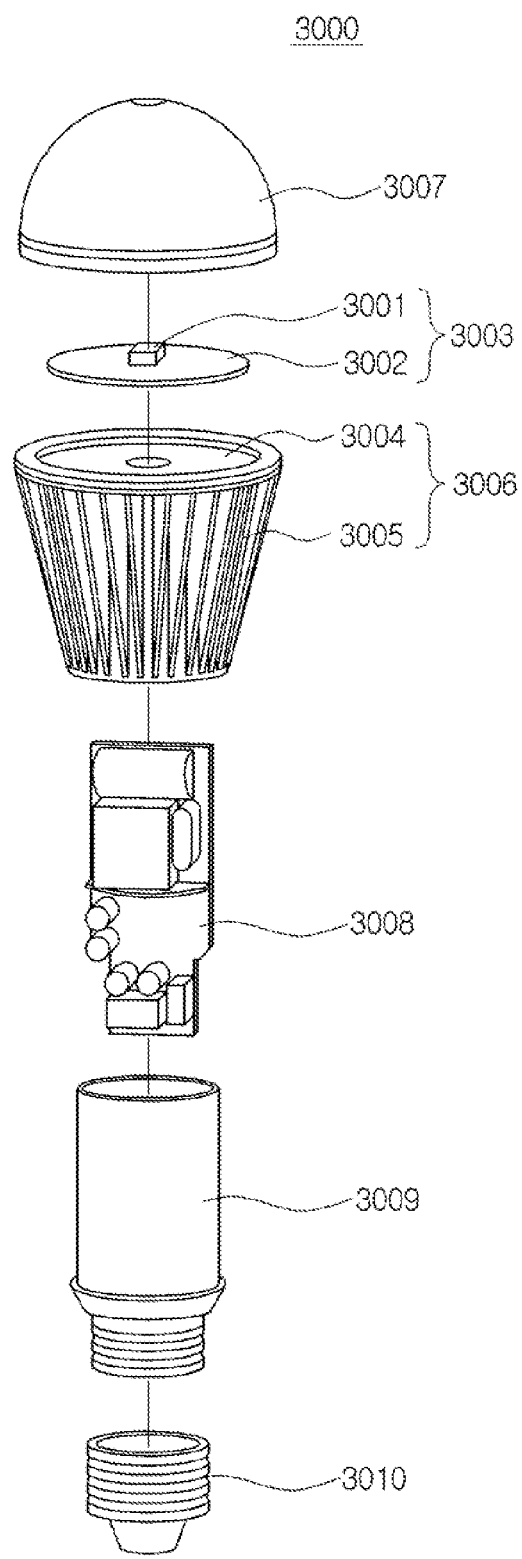
FIG. 11 illustrates a lighting device including an LED driving device according to an exemplary embodiment.

FIG. 11 illustrates an example in which an LED driving device according to an exemplary embodiment is applied to a lighting device.

Referring to an exploded perspective view of FIG. 11, a lighting device 3000 may be a bulb type lamp by way of example. The lighting device 3000 may include a light emitting module 3003, a driver 3008, and an external connector 3010. In addition, the lighting device 3000 may further include a structure of appearance such as external housing 3006 and internal housing 3009 and a cover 3007. Although the exemplary embodiment illustrates the form in which one semiconductor light emitting device 3001 is mounted on a circuit board 3002, a plurality of semiconductor light emitting devices may be mounted on the circuit board 3002 as needed. In addition, instead of directly mounting the semiconductor light emitting device 3001 on the circuit board 3002, the semiconductor light emitting device may be manufactured as a package type light emitting device and then mounted thereon.

In addition, in the lighting device 3000, the light emitting module 3003 may include the external housing 3006 serving as a heat radiating unit, and the external housing 3006 may include a heat radiating plate 3004 directly contacting the light emitting module 3003 to improve a heat radiation effect. In addition, the lighting device 3000 may include the cover 3007 mounted on the light emitting module 3003 and having a convex lens shape. The driver 3008 may be installed in the internal housing 3009 to be connected to the external connector 3010 having a structure such as a socket structure so as to receive power from an external power supply. In addition, the driver 3008 may convert the received power into a current source suitable for driving the semiconductor light emitting device 3001 of the light emitting module 3003 to then be supplied. The driver 3008 may include at least one LED driving device. For example, the at least one LED driving device may be a LED driving device 100 or a LED driving device 200 illustrated in FIGS. 1 to 5, and may receive a control command provided externally through a digital addressable lighting interface (DALI) communications protocol.

According to exemplary embodiments in the present disclosure, an AC driver may perform controlling so that an LED is operated using rectified power output by a rectifier without a separate AC-DC converter. In addition, as a light amount controller may perform control so that levels of currents applied to LEDs are changed depending on an increase or a decrease in peak values of rectified power, a deviation in levels of light output from the LEDs depending on the change in the rectified power input to the LEDs may be significantly reduced.

While certain exemplary embodiments have been shown and described above, it will be apparent to those skilled in the art that modifications and variations could be made without departing from the scope of the present disclosure as defined by the appended claims.

What is claimed is:

1. A light emitting diode (LED) driving device driving a plurality of LED groups, the device comprising:
    a rectifier configured to rectify alternating current (AC) power to generate rectified power;
    an AC driver configured to control operations of the plurality of LED groups so that the plurality of LED groups receive the rectified power generated by the rectifier; and
    a light amount controller configured to reduce an amount of current applied to the plurality of LED groups when a peak value of the rectified power is increased, and increase the amount of current applied to the plurality of LED groups when the peak value of the rectified power is reduced,
    wherein the AC driver is configured to compare the rectified power with a first threshold voltage and a second threshold voltage that is higher than the first threshold voltage, and connect at least two of the plurality of LED groups to each other in parallel or in series based on a result of the comparison.

2. The LED driving device of claim 1, wherein the light amount controller comprises:
    a voltage detector configured to detect the rectified power to generate a first voltage; and
    a current controller configured to adjust a level of a current applied to the plurality of LED groups according to the first voltage.

3. The LED driving device of claim 2, wherein the voltage detector comprises a regulator circuit configured to detect the rectified power and convert the rectified power into the first voltage, and
    wherein the first voltage has a substantially constant level.

4. The LED driving device of claim 2, wherein the current controller comprises:
    a switching device including an output terminal, an input terminal, and a control terminal, the output terminal connected to at least one LED group of the plurality of LED groups; and
    an operational amplifier configured to receive the first voltage and a reference voltage and control a current flowing in the at least one LED group connected to the output terminal of the switching device.

5. The LED driving device of claim 2, wherein the current controller comprises:
    a voltage follower configured to receive the first voltage; and
    a switching device configured to control a current flowing in the at least one LED group of the plurality of LED groups through an output from the voltage follower circuit.

6. The LED driving device of claim 1, wherein the AC driver is configured to divide a single period of the rectified power into a plurality of sections, and control operations of the plurality of LED groups in the plurality of sections.

7. The LED driving device of claim 6, wherein the light amount controller is configured to reduce a current applied to the plurality of LED groups in the plurality of sections when a peak value of the rectified power is increased, and increase a current applied to the plurality of LED groups in the plurality of sections when the peak value of the rectified power is decreased.

8. The LED driving device of claim 6, wherein the AC driver is configured to turn on a first LED group of the plurality of LED groups in a first section of the plurality of sections in which a level of the rectified power is lower than the first threshold voltage, and turn on the first LED group and a second LED group of the plurality of LED groups having a level of light output from the second LED group that is lower than a level of light output from the first LED group in a second section of the plurality of sections in which the level of the rectified power is higher than the first threshold voltage and lower than the second threshold voltage.

9. The LED driving device of claim 6, wherein the AC driver is configured to connect a first LED group and a second LED group of the plurality of LED groups to each other in parallel to then be turned on in a first section of the plurality of sections in which a level of the rectified power is lower than the first threshold voltage, and connect the first LED group and the second LED group to each other in series to then be turned on in the second section in which a level of the rectified power is higher than the first threshold voltage and lower than the second threshold voltage.

10. The LED driving device of claim 9, wherein the first LED group and the second LED group are configured to output substantially the same level of light.

11. A lighting device comprising:
    a light source comprising a plurality of light emitting diode (LED) groups;
    a rectifier configured to rectify alternating current (AC) power to generate rectified power;
    an AC driver configured to control operations of the plurality of LED groups so that the light source receives the rectified power generated by the rectifier and emits light; and
    a light amount controller configured to reduce an amount of current applied to the plurality of LED groups when a peak value of the rectified power is increased, and increase the amount of current applied to the plurality of LED groups when the peak value of the rectified power is reduced,
    wherein the AC driver is configured to compare the rectified power with a first threshold voltage and a second threshold voltage that is higher than the first threshold voltage, and connect at least two of the plurality of LED groups to each other in parallel or in series based on a result of the comparison.

12. The lighting device of claim 11, wherein the light amount controller comprises:
    a regulator circuit configured to generate a first voltage having a substantially constant level using the rectified power; and a constant current controller configured to control a current flowing in at least a portion of the plurality of LED groups by comparing the first voltage with a reference voltage.

13. The lighting device of claim 11, further comprising:
a regulator circuit configured to generate a first voltage having a substantially constant level using the rectified power;
a voltage follower configured to receive the first voltage generated by the regulator circuit; and
a constant current controller configured to control a current flowing in at least a portion of the plurality of LED groups based on an output from the voltage follower circuit.

14. The lighting device of claim 11, wherein each LED group of the plurality of LED groups has a level of light output that is different from a level of light output from other LED groups.

15. The lighting device of claim 11, wherein each LED group of the plurality of LED groups has substantially the same level of light output.

16. A light emitting diode (LED) driving device comprising:
a rectifier configured to rectify alternating current (AC) power and provide the rectified power directly to a plurality of LED groups;
a light amount controller configured to control supply of the rectified power to the plurality of LED groups; and
an AC driver configured to drive the plurality of LED groups according to the rectified power;
wherein the light amount controller is configured to control the AC driver to reduce an amount of current applied to the plurality of LED groups when a peak value of the rectified power is increased, and increase the amount of current applied to the plurality of LED groups when the peak value of the rectified power is reduced,
wherein the AC driver is configured to compare the rectified power with a first threshold voltage and a second threshold voltage that is higher than the first threshold voltage, and connect at least two of the plurality of LED groups to each other in parallel or in series based on a result of the comparison.

17. The LED driving device of claim 16, wherein the AC driver is configured to connect the plurality of LED groups together in a connection configuration comprising at least one of a parallel configuration in which a portion of the plurality of LED groups are connected together in parallel, and a series configuration in which a portion of the plurality of LED groups are connected together in series.

18. The LED driving device of claim 17, wherein each of the LED groups has a same light output level, and the light amount controller is configured to control the AC driver to selectively connect the plurality of LEDs groups together in at least one of the parallel configuration and the series configuration according to the rectified power.

19. The LED driving device of claim 16, wherein each of the LED groups has a different light output level, and the AC driver is configured to change a number of the LED groups turned on according to the rectified power.

20. The LED driving device of claim 16, wherein the rectifier is a diode bridge circuit, and the rectifier, the light amount controller, and the AC driver drive the plurality of LED groups directly without converting the AC power to direct current (DC) power.

* * * * *